United States Patent

Lampkin

[15] 3,688,302

[45] Aug. 29, 1972

[54] ANALOG TO DIGITAL ENCODER

[72] Inventor: Curt M. Lampkin, 4225 Langley Rd., Cincinnati, Ohio 45217

[22] Filed: May 4, 1970

[21] Appl. No.: 34,502

[52] U.S. Cl. ............340/347 P, 250/214 R, 307/311, 330/22, 330/40

[51] Int. Cl. ......H03k 3/42, H03k 13/02, H03k 13/18

[58] Field of Search .340/346 P, 347 CC; 250/214 R; 84/1.18; 328/2.3; 307/311, 310, 297; 330/22, 23, 38 M, 40

[56] References Cited

UNITED STATES PATENTS

| | | | |
|---|---|---|---|
| 3,553,500 | 1/1971 | Easter | 307/311 |
| 3,524,184 | 8/1970 | Brean | 340/347 P |
| 3,436,613 | 4/1969 | Gerhard | 307/311 X |
| 3,381,141 | 4/1968 | Millon | 307/310 X |
| 3,403,265 | 9/1968 | Apfelbeck | 307/310 X |
| 3,364,357 | 1/1968 | Burwen | 307/310 X |
| 3,104,323 | 9/1963 | Over, Jr. et al. | 307/311 X |

*Primary Examiner*—Maynard R. Wilbur
*Assistant Examiner*—Thomas J. Sloyan
*Attorney*—Burmeister, Palmatier and Hamby

[57] ABSTRACT

A photoresponsive device employing a silicon photocell to excite on illumination of the photocell a transistor in a discriminator circuit and drive the transistor from a non-conducting to a conducting condition. The photovoltaic output of the silicon cell is added to the potential of the direct current potential of a bias source to exceed the threshold conduction potential of the discriminator transistor. Thermostability is achieved by employing a transistor in the bias source of identical type and similar characteristics to the discriminator transistor. The discriminator transistor has an emitter-collector circuit which includes a load resistor, and the output which is developed across the load resistor is amplified by a common emitter transistor amplifier circuit. The transistor of the amplifier circuit is a N-P-N, while the transistor of the discriminator circuit is a P-N-P type. A switching transistor is used in the common emitter circuit of the discriminator transistor. In the optical encoder disclosed, a separate discriminator circuit is employed for each silicon photodiode, but a single direct current bias source is employed. The switching transistors are pulsed, either sequentially or at the same time to interrogate the photodiodes.

14 Claims, 5 Drawing Figures

Inventor
CURT M. LAMPKIN
By Burmeister, Palmatier & Hamby
Attorney

Inventor
CURT M. LAMPKIN
By Burmeister, Palmatier & Hamby
Attorneys

ANALOG TO DIGITAL ENCODER

The present invention relates generally to photoresponsive devices, and more particularly to analog to digital encoders. In particular, the present invention also relates to use of silicon photodiodes in analog to digital encoders.

Optical encoders generally come in two classes, namely, direct reading encoders in which the shaft angle is determined by sampling of a plurality of photocells which confront separate tracks of a code disc carried by the shaft, or the incremental type encoder in which rotation of a code disc or other code member with a single track confronting a single photocell generates pulses which are counted from an arbitrary zero position. The present invention may be used with either type of encoder, but for simplicity, is illustrated applied to a direct reading encoder. U.S. Pat. No. 3,023,406 of Edward M. Jones, dated Feb. 27, 1962, entitled "OPTICAL ENCODER" discloses a direct reading encoder. An incremental encoder is disclosed in U.S. Pat. No. 3,058,001 of Michael L. Dertouzos, dated Oct. 9, 1962, entitled "PHOTOELECTRIC ENCODER".

The photoresponsive cells used in both direct reading and incremental type encoders have limited the use of photoelectric encoders. The incremental type encoder can tolerate larger cells, since only a single cell need be used, and the cost of photocells in incremental encoders is less significant for the same reason. However, in both types of encoders, it is desired that the photocell produce a rapid response to changes in illumination, that the photocell be relatively insensitive to temperature changes and capable of being compensated for temperature changes, and that the photocells be reliable. Silicon P-N junction diodes have been used in photoelectric encoders, but their use has been limited by the relatively large capacity of the diode, the relatively low leakage resistance of the diode, and the relatively large sensitive areas of such cells. The latter factor has been a serious deterent to the use of silicon photodiodes for direct reading encoders, since there is a necessity for the cells to be placed in adjacent positions at very close spacing. Silicon photodiodes, however, have been significantly improved in recent years, as disclosed in U.S. Pat. No. 3,552,435 of John Brean and Curt M. Lampkin, entitled "PHOTODIODE ASSEMBLY FOR OPTICAL ENCODER", granted Aug. 4, 1970. In accordance with the teachings of Brean and Lampkin, silicon photodiodes have been produced with significantly higher leakage resistance, significantly smaller sensitive areas, and significantly smaller capacity between the electrodes.

The electrical output output of a silicon photodiode is relatively low, and this output must be amplified in order to provide a useful output. It is an object of the present invention to provide an improved electrical circuit for utilizing the electrical output of a silicon photodiode.

It is also an object of the present invention to provide an improved temperature compensation means for a silicon photodiode in order to permit operation of an analog to digital encoder using photodiodes over a wider temperature range.

It is also desirable to directly drive an electronic switching circuit with a photodiode, thereby providing a discrimination between illuminated and non-illuminated output of the photodiode. The electrical output produced by an illuminated silicon photodiode is inadequate to excite a transistor switching circuit, and it is one of the objects of the present invention to provide a means for utilizing a silicon photodiode to directly excite a transistor switching circuit.

Briefly, the objects of the present invention are achieved by adding a bias potential to the electrical output of the silicon photodiode, the sum of the bias potential and electrical output of the illuminated photodiode being adequate to raise the potential of the base of the transistor in the switching circuit to result in condution, whereas the bias voltage alone is inadequate for this purpose. A common emitter switching circuit is utilized, and interrogation of the photodiode is achieved by incorporating a transistor switch in the emitter circuit of the discriminator or switching circuit. The electrical output is amplified by a transistor amplifier using a common emitter circuit coupled to a load resistor in the collector circuit of the discriminator or switching circuit. The direct current bias supply utilizes a transistor of identical type to that used in the discriminator or switching circuit and employs the emitter-base potential of the bias transistor to provide the bias necessary. As a result, variations in ambient temperature affect the bias supply in identical manner with the discriminator circuit. The circuit also uses a P-N-P transistor in the discriminator circuit and a N-P-N transistor in an amplifier circuit coupled to the collector circuit of the discriminator circuit. In this manner, proper voltage distributions are achieved.

Further advantages will be readily apparent from a further consideration of this specification particularly when viewed in the light of the drawings, in which.

Figure 1:
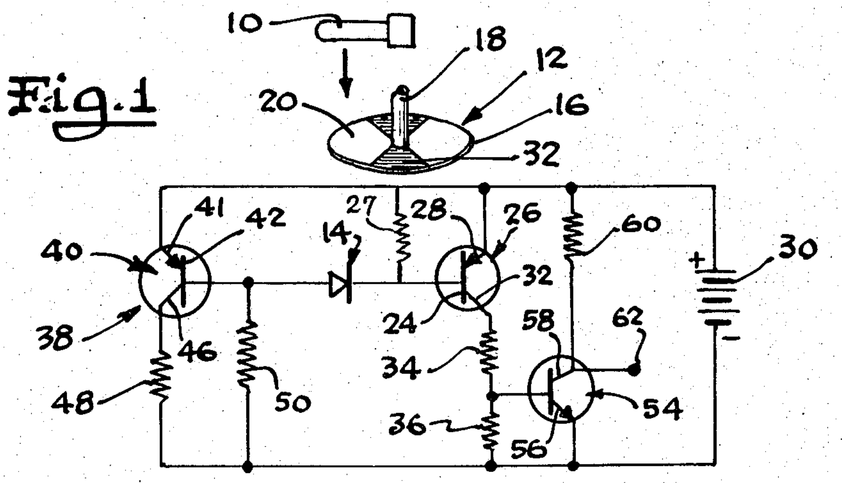
FIG. 1 is a schematic diagram of the mechanical and electrical apparatus comprising a photoelectric device according to the present invention.

FIG. 1 schematically illustrates the basic photoresponsive device of the present invention. A light source 10 in the form of a lamp directs light through a shutter 12 and to a silicon photodiode 14. The photodiode 14 is constructed in the manner described in U.S. Pat. No. 3,552,435 of John Brean and the present inventor. The shutter 12 is illustrated as a disc 16 which is mounted on a rotatable shaft 18, the disc having transparent sectors 20 and opaque sectors 22. Rotation of the disc 16 will therefore periodically interrupt the light impinging upon the photodiode 14.

A silicon photodiode has advantages over germanium and other types of cells in that silicon cells are fast in responding to changes in light level, and they may be operated over a wide range of temperatures. However, such cells produce a relatively small photovoltaic response to illumination over darkness, namely approximately 0.2 volts when illuminated by a conventional lamp as used in optical encoders.

In FIG. 1, the photodiode 14 has its cathode connected to the base 24 of the transistor 26 and the photodiode is thus connected to pass positive charges to the base 24 of a transistor 26. The transistor 26 is connected in a discriminator or switching circuit. A bias resistor 27 is connected between the base 24 and the positive terminal of the power source 30. The transistor 26 is a common emitter switching circuit, and has an emitter 28 connected to the positive terminal of a direct current power source 30, illustrated as a battery. The transistor 26 also has a collector 32 connected through two serially connected resistors 34 and 36 to the negative terminal of the power source 30.

Transistor 26 is a P-N-P silicon transistor which requires a base-emitter voltage far in excess of the photovoltaic voltage of the photodiode 14 for conduction. In accordance with the present invention, a bias potential is added to the photovoltaic output of the photodiode 14 to exceed the base-emitter threshold potential for conduction of the transistor 26. By making the bias potential less than the base-emitter threshold potential for conduction of transistor 26, transistor 26 will only conduct during periods in which illumination from the source 10 passes through the shutter 12 and impinges upon the photodiode 14. When illumination is cut-off, the emitter-collector current through transistor 26 is terminated, thereby providing a switching action. In FIG. 1, a direct current bias source, designated 38, is provided between the anode terminal of the photodiode 14 and the positive terminal to the power source 30, and the bias source 38 places a potential on the photodiode 14 which is less than the base-emitter threshold potential of the transistor 26, but the photovoltaic output of the photodiode plus the bias potential exceeds this threshold. In one particular construction, the bias potential is approximately −0.5 volts with respect to the positive terminal of the power source 30, the source 30 having a potential of 5 volts direct current and the transistor 26 being type 2N4058 and requiring a collector to emitter potential for conduction of −0.6 volts direct current. The illuminated photodiode 14 has a photovoltaic output of −0.2 volts, thereby providing sufficient potential on illumination to cause a switching action in the transistor 26.

The bias source 38 utilizes a P-N-P transistor 40 with a base 42 connected to the photodiode 14 and an emitter 44 connected to the positive terminal of the power source 30. Hence, the bias source also uses a grounded emitter circuit to provide similar operating characteristics to the transistor 26. The transistor 40 has a collector 46 connected through a resistor 48 to the negative terminal of the power source 30. A resistor 50 is also connected from the base 42 to the negative terminal of the power source 30 to provide proper bias on the base 42. The transistors 26 and 40 are of identical type so that changes in ambient temperature will affect operation of the two transistors similarly. It is to be noted that an increase in temperature will result in an increase in current flowing through the transistor 40 and a decrease in the emitter to base potential. Also, an increase in ambient temperature results in a decrease in the emitter to base potential of transistor 26 required for conduction.

When photodiode 14 is illuminated, the combined bias voltage of the source 38 and photovoltaic voltage of the photodiode 14 causes the transistor 26 to abruptly conduct, hence producing a voltage drop across the resistors 34 and 36. Even though conduction in transistor 26 on illumination is relatively abrupt, the leading edge of the photovoltaic output of the photodiode 14 is a function of time. Hence, if the bias voltage of the source 38 were constant with temperature changes, an increase in temperature would result in transistor 26 conducting sooner than at a lower temperature, and this effect would be accentuated by the increased output of the photodiode 14 with increased temperature. Depending on the time of interrogation, this fact may result in errors in digital output resulting from changes in ambient temperature.

The voltage developed across resistor 36 is amplified by an N-P-N transistor 54 connected in an amplifier circuit. The transistor 54 has a base 52 electrically connected to the junction between the resistors 34 and 36, the transistor 54 being connected in an amplifier circuit. The transistor 54 has an emitter 56 connected to the negative terminal of the power source 30, and a collector 58 connected through a resistor 60 to the positive terminal of the power source 30. The output of the switching circuit appears upon a terminal 62 connected to the collector 58.

Figure 2:
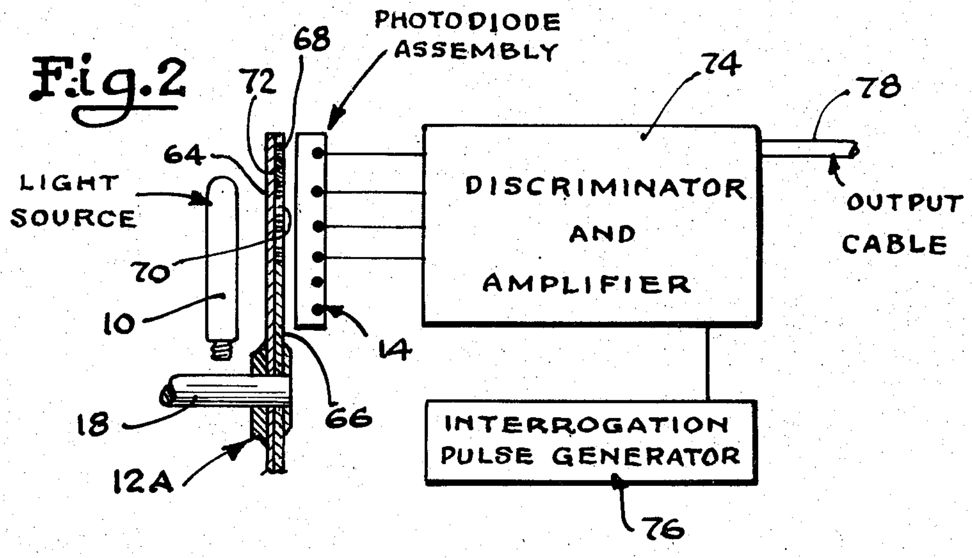
FIG. 2 is a schematic block diagram of an analog to digital encoder employing the photoelectric device of FIG. 1.

FIG. 2 illustrates an optical analog to digital encoder which utilizes the light source 10, a code disc 12A, and a photodiode assembly $\overline{14}$. A code disc is mounted to rotate with the shaft 18, and is constructed with a transparent disc 64 provided with a layer of opaque material 66. The opaque material contains tracks 68 of alternate transparent sectors 70 and opaque sectors 72.

The photodiode assembly is disposed upon a radius of the code disc 12A and contains a silicon photodiode confronting each of the tracks 68 of the code disc 12. The photodiode assembly is constructed in the manner of the United States patent of John Brean and the present inventor U.S. Pat. No. 3,552,435.

Each of the photodiodes of the assembly $\overline{14}$ is connected to a discriminator and amplifier 74. An interrogation pulse generator 76 is connected to the discriminator and amplifier, and the output of the encoder appears upon an output cable 78. If the interrogation pulse generator delivers sequential pulses, that is, pulses on different output terminals spaced in time, the output cable will have a single output lead for all photodiodes, since the pulses from the photodiodes will appear in time sequence. If the interrogation pulse generator produces a single pulse for all photodiodes, the output cable must have a separate lead for each photodiode. This will be described further in connection with FIGS. 4 and 5.

Figure 3:
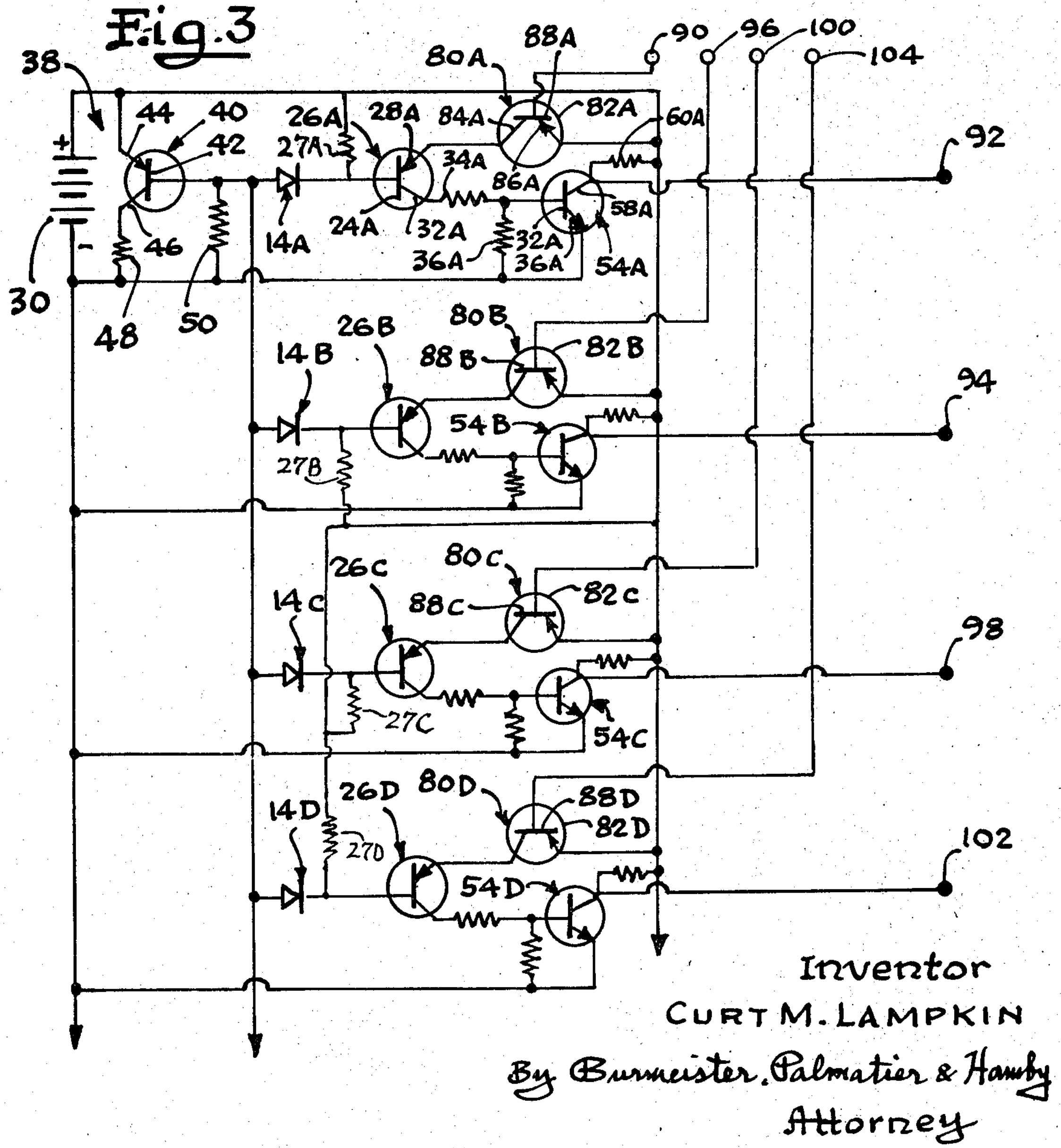
FIG. 3 is a schematic electrical circuit diagram of the analog to digital encoder illustrated in FIG. 2.

The individual photocells of the photodiode assembly $\overline{14}$ are illustrated in FIG. 3 as 14A, 14B, 14C, and 14D. It is to be understood that only four tracks of the code disc 12, four photodiodes, and four discriminator and amplifier circuits are illustrated, thus providing a four digit code output. The present invention is applicable to encoders with any number of digits, and four have been shown for convenience.

In FIG. 3, the bias supply 38 is identical to that shown in FIG. 1, and identical reference numerals have been applied. It will be noted that the bias supply 38 is connected to one terminal of all four photodiodes 14A, 14B, 14C, and 14D.

The photodiode 14A is connected to a discriminator or switching transistor 26A of the P-N-P type which is identical to the transistor 26 of FIG. 1. The transistor 26A has a base 24A, an emitter 28A, and a collector 32A. The collector 32A is connected to the negative terminal of the power source through two resistors 34A and 36A connected in series. The base 24A of transistor 26A is connected to the terminal of the photodiode 14A opposite the bias source 38 and to a bias resistor 27A. The emitter 28A is connected through a transistor switch 80A to the positive terminal of the power source 30, and hence the transistor 26A is in a common emitter circuit since it is connected to the common terminal when the switch 80A is closed.

The switch 80A has a transistor 82A which has a collector 84A connected to the emitter 28A of the transistor 26A. Transistor 82A also has an emitter 86A which is connected to the positive terminal of the power source. Transistor 80A also has a base 88A which is connected to a terminal 90 which is adapted to be connected to a pulse generator for interrogation purposes as will be described hereinafter.

A common emitter amplifier using an N-P-N transistor 54A is coupled to the collector circuit of the transistor 26A. The amplifier is identical to that of FIG. 1, and transistor 54A has an emitter 36A, base 32A, and collector 58A. A resistor 60A is connected from the collector 58A to the positive terminal of the power source, and the output is conducted from the collector 58A to a terminal 92.

It will be noted that photodiode 14B is connected to a transistor 26B connected in an identical circuit to that of transistor 26A. Electrical output of photodiode 14B is amplified by a common emitter N-P-N transistor 54B and appears upon an output terminal 94. In like manner, transistor 26B is connected in a common emitter circuit which may be interrupted by a switch 80B formed by transistor 82B. The transistor 82B is connected in an identical circuit as transistor 82A, and has a base 88B connected to a terminal 96 for an interrogation pulse.

In like manner, photodiode 14C is connected to an identical discriminator circuit employing transistor 26C. An identical amplifier circuit employing transistor 54C is also employed in connection with photodiode 14C, and the electrical output appears on terminal 98. A switch 80C using transistor 82C is also identical to the switch 80B, and the base 88C of transistor 82C is connected to a terminal 100.

Photodiode 14D is connected to a discriminator identical to the discriminators 26A employing a transistor 26D. The output of the discriminator is amplified through a transistor 54D and appears upon an output terminal 102. The transistor 26D is also in a common emitter circuit which may be interrupted by a switch 80D which uses a transistor 82D with a base 88D connected to a terminal 104.

Figure 4:
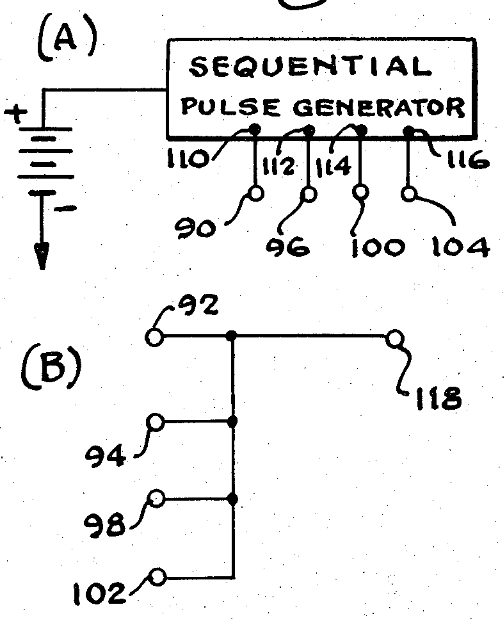
FIG. 4 is a schematic electrical view of apparatus for providing parallel output for the encoder of FIGS. 2 and 3.

FIG. 4 illustrates a circuit obtaining parallel output from the encoder, that is, an output on each of the terminals 92, 94, 98 and 102 at the same time. A pulse generator 106 is provided with one terminal connected to each of the terminals 90, 96, 100, and 104. The other terminal of the pulse generator is connected to the positive terminal of the source 30 so that the pulse of the pulse generator is simultaneously applied to each of the bases 88A, 88B, 88C, and 88D of the transistor switches 80A, 80B, 80C, and 80D.

Figure 5:
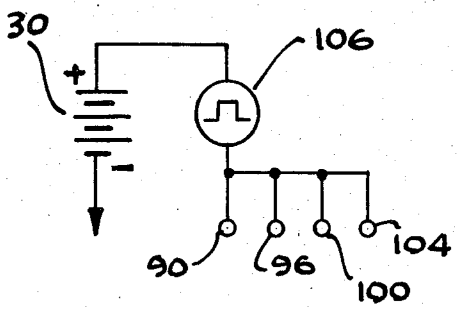
FIG. 5 is a schematic electrical circuit diagram of apparatus for providing sequential electrical output for the analog to digital encoder of FIGS. 2 and 3.

FIG. 5 illustrates the apparatus required for obtaining sequential pulse output. In FIG. 5(A) a sequential pulse generator 108 is illustrated, and the sequential pulse generator 108 has output terminals 110, 112, 114, and 116. In each cycle, a separate pulse spaced in time from the preceding pulses appears upon each of the terminals 110, 112, 114, 116. These terminals are electrically connected to the terminals 90, 96, 100, and 104, respectively, and hence each of the switching circuits or discriminator circuits will be interrogated in the the sequence, resulting in outputs appearing on the terminals 92, 94, 98, and 102 in sequence. FIG. 5(B) shows these terminals 92, 94, 98, and 102 interconnected and connected to a single output terminal 118. Hence, on the output terminal 118 the outputs of each of the photodiodes 14A, 14B, 14C, and 14D will appear in sequence.

It is not strictly necessary to interrogate the photodiodes for all purposes. When the code disc 12A is rotating, all of the output terminals 92, 94, 98, and 102 will receive a pulse (or no indication) correlated to the positioning of the disc 12A if the switches 80A, 80B, 80C, and 80D are closed. Hence, these switches may be eliminated, as shown in FIG. 1. Under these circumstances, an increase in temperature will result in the transitions of the code disc being reflected on the output terminals 92, 94, 98, and 102 sooner because of the increase in output of the photodiodes at higher temperatures. For most purposes, the output is required at a precise time, providing an additional reason for interrogation.

Those skilled in the art will readily appreciate many modified constructions of the present invention and many utilities of the present invention beyond that here set forth. It is therefore intended that the scope of the present invention be not limited by the foregoing disclosure, but rather only by the appended claims. In the appended claims, P-N-P transistors are differentiated from N-P-N transistors by defining the impurity doping of the semi-conductor material to be of a different type, that is, doping achieving an excess of electrons or an excess of holes.

I claim:

1. A photoresponsive device adapted for use in an analog to digital encoder comprising, in combination: a light source, a silicon photovoltaic photodiode having a first terminal and a second terminal and adapted to generate a voltaic potential between said terminals responsive to light from the source, one of said terminals being positive and the other negative in polarity, a mechanically actuatable light shutter disposed between the light source and the silicon photodiode, a transistor having a base, a collector and an emitter, the emitter and collector being of semi-conductor material doped with impurities of a first type and the base being of semi-conductor material doped with impurities of a second type, the base of said transistor being electrically connected to the second terminal of the photodiode, said transistor being electrically connected in a common emitter switching circuit having a direct current power source in series with the emitter and collector of the transistor, a direct current bias source connected in a series circuit between said first terminal of said photodiode and said emitter of said transistor, said transistor having a characteristic such that a minimum threshold potential of one polarity is required between said base and said emitter to produce conduction between said emitter and said collector, said photovoltaic photodiode and said bias source being additively polarized whereby the sum of their output voltages appears between said base and said emitter and tends to cause conduction between said emitter and said collector of said transistor, said bias source having an output voltage less than said threshold potential and thus insufficient by itself to cause conduction between said emitter and said collector of said transistor, said photovoltaic photodiode when illuminated by said light source having a photovoltaic output voltage which is sufficient when added to said output voltage of said bias source to equal or exceed said threshold potential and thereby to cause conduction between said emitter and said collector of said transistor, and a load electrically connected in the series emitter-collector circuit of the transistor whereby illumination of the silicon photodiode causes the transistor to conduct and to develop a potential across the load.

2. A photoresponsive device comprising the combination of claim 1 in combination with a direct current amplifier coupled to the load, said direct current amplifier comprising a second transistor connected in a common emitter amplifier circuit, said second transistor having a base of semi-conductor material doped with impurities of the first type and a collector and an emitter of semi-conductive material doped with impurities of the second type, the load being electrically connected in a series circuit with base and emitter of the second transistor, and the collector and emitter of the second transistor being electrically connected in a series electrical circuit with a second load and the direct current power source, whereby the electrical output of the device appears across the second load.

3. A photoresponsive device comprising the combination of claim 1 wherein said bias source includes means for changing the potential of the bias source with temperature in approximately the same manner as the base-to-emitter threshold potential of the transistor changes with temperature.

4. A photoresponsive device comprising the combination of claim 1 wherein the direct current bias source comprises an additional transistor of the same type as the first-mentioned transistor and of similar characteristics, said additional transistor having a base electrically connected to the first terminal of the photodiode, said additional transistor having a collector and an emitter connected in a series circuit with the power source and a transistor, said emitter of said additional transistor being connected to said emitter of said first-mentioned transistor, and means for causing conduction in said additional transistor, whereby the potential difference between the base and emitter of said additional transistor is utilized as the bias potential, the variation of said potential difference with temperature changes being approximately the same as the variation of said threshold voltage of said first-mentioned transistor.

5. A photoresponsive device comprising the combination of claim 4 wherein the first-mentioned and additional transistors are silicon transistors.

6. A position responsive analog to digital encoder comprising, in combination: a code member adapted to be moved responsive to positional changes to be encoded and having a plurality of tracks of transparent sectors separated by opaque sectors, each track moving responsive to positional changes normal to a read-out line disposed in a fixed position relative to the code member, a light source confronting one side of the code member and illuminating each track of the code member at the read-out line, a plurality of photovoltaic photodiodes having a first terminal and a second terminal, each track of the code member being confronted by a photodiode at the read-out line thereof to receive illumination from the track, a plurality of switching transistors, each switching transistor having a base of semi-conductor material doped with impurities of a first type and a collector and emitter of semi-conductor material doped with impurities of a second type, the second terminal of each photodiode being connected to the base of a different switching transistor, each of said switching transistors being connected in a separate common emitter switching circuit and having a collector-emitter circuit including a direct current power source and a resistor, a direct current bias source connected in common between said first terminal of each diode and said emitter of each transistor, each transistor having a characteristic such that a minimum threshold potential of one polarity is required between said base and said emitter thereof to produce conduction between said emitter and said collector thereof, each photodiode and said bias source being additively polarized whereby the sum of their output voltages appears between the base and the emitter of the corresponding transistor and tends to cause conduction between said emitter and said collector thereof, said bias source having an output voltage less than said threshold potential and thus insufficient by itself to cause conduction in said transistors, each photodiode when illuminated by said light source having a photovoltaic output voltage which is sufficient when added to said output voltage of said bias source to equal or exceed said threshold potential and thereby to cause conduction between said emitter and said collector of the corresponding transistor, and a load electrically connected in the series emitter-collector circuit of each switching transistor.

7. A position responsive analog to digital encoder comprising the combination of claim 6 wherein said bias source includes means for changing the potential of the bias source with ambient temperature in approximately the same manner as the base-to-emitter threshold potentials of the switching transistors change with ambient temperature.

8. A position responsive analog to digital encoder comprising the combination of claim 6 wherein the direct current bias source comprises a bias transistor of the same type as the switching transistors and of similar characteristics, said bias transistor having a base electrically connected to the first terminal of each photodiode, said bias transistor having an emitter and a collector connected in a series circuit with the power source and a resistor, said emitter of said bias transistor being connected to said emitters of said switching transistors, and means for causing conduction in said bias transistor, whereby the voltage difference between the base and emitter of said bias transistor is utilized as the bias potential, the variation of said voltage difference with temperature changes being approximately the same as the variation of said threshold voltage of said switching transistors.

9. A position responsive analog to digital encoder comprising the combination claim 8 in which said last-mentioned means includes a second resistor connected between the base of the bias transistor and the terminal of the power source connected to the collector of the bias transistor.

10. A position responsive analog to digital encoder comprising the combination of claim 6 in combination with a plurality of potential responsive electronic switches electrically connected in the corresponding emitter-to-power source circuits of the respective switching transistors.

11. A position responsive analog to digital encoder comprising the combination of claim 10 wherein each electronic switch comprises a transistor having a collector connected to the emitter of the associated switching transistor and an emitter electrically connected to the power source, each electronic switch transistor being rendered conductive in response to a potential impressed on the base thereof.

12. A position responsive analog to digital encoder comprising the combination of claim 11 wherein the bases of all electronic switch transistors are interconnected and connected to one terminal of a periodic pulse generator, the other terminal of the pulse generator being electrically connected to the power source.

13. A position responsive analog to digital encoder comprising the combination of claim 11 in combination with a sequential pulse generator having a plurality of output terminals, said sequential pulse generator producing a series of pulses at time intervals on different output terminals thereof, the base of each electronic switch transistor being connected to a different output terminal.

14. A position responsive analog to digital encoder comprising the combination of claim 6 in combination with a plurality of direct current amplifiers, each amplifier being coupled to the load of a different switching transistor and having a transistor with a base of semiconductor material doped with impurities of the first type and an emitter and a collector doped with impurities of the second type, each amplifier being connected in a common emitter amplifier circuit.

* * * * *

PO-1050
(5/69)

UNITED STATES PATENT OFFICE
CERTIFICATE OF CORRECTION

Patent No. 3,688,302 Dated August 29, 1972

Inventor(s) Curt M. Lampkin

It is certified that error appears in the above-identified patent and that said Letters Patent are hereby corrected as shown below:

On the front page, After the name and address of the inventor insert: --[73] Assignee: D. H. Baldwin Company, Cincinnati, Ohio --.

Col. 5, line 26, Change "36A" to --56A--;

same line, Change "32A" to --52A--.

Col. 6, line 11, At the beginning of the line, delete "the the".

Col. 8, line 43, After "load" insert --comprising said resistor and --.

In the drawings, Fig. 1, Change "32" to --22-- as applied to the opaque areas of the disc 12.

Fig. 1, Add --52-- as applied to the base of the transistor 54.

Fig. 3, Change "32A" to --52A-- as applied to the base of the transistor 54A.

Fig. 3, Change "36A" to --56A-- as applied to the emitter of the transistor 54A.

Signed and sealed this 13th day of February 1973.

(SEAL)
Attest:

EDWARD M.FLETCHER,JR.
Attesting Officer

ROBERT GOTTSCHALK
Commissioner of Patents